United States Patent
Marland

[19]

[11] Patent Number: 5,821,831
[45] Date of Patent: Oct. 13, 1998

[54] DIPLEX FILTER COMPRISING MONOTONIC POLES

[75] Inventor: Dale Marland, Erieville, N.Y.

[73] Assignee: Eagle Comtronics, Inc., Clay, N.Y.

[21] Appl. No.: 644,104

[22] Filed: May 10, 1996

[51] Int. Cl.⁶ ........................... H03H 7/46
[52] U.S. Cl. ........................... 333/132; 333/175
[58] Field of Search ............... 333/132, 167, 333/174; 455/78, 82; 370/297

[56] References Cited

U.S. PATENT DOCUMENTS

| | | | |
|---|---|---|---|
| 4,623,762 | 11/1986 | Boeckmann et al. | 379/412 X |
| 5,390,337 | 2/1995 | Jelinek et al. | 333/132 X |
| 5,548,255 | 8/1996 | Spielman | 333/132 |

FOREIGN PATENT DOCUMENTS 1-303912  12/1989  Japan ........................... 333/132

OTHER PUBLICATIONS

Krauss et al, *Solid State Radio Engineering*, John Wiley & Sons, p. 126, 1980.

*Primary Examiner*—Robert Pascal
*Assistant Examiner*—Justin P. Bettendorf
*Attorney, Agent, or Firm*—Parkhurst & Wendel

[57] ABSTRACT

A three port diplex filter circuit with common, low, and high terminals having a frequency response up to 1 GHz comprises a Chebychev-like low pass filter connected between the common and low terminals and a Chebychev-like high pass filter connected between the common and high terminals, wherein each filter section further comprises a series resonant circuit connected between the low and high terminals, respectively, and ground. At lower crossover values, inductors are wound on powdered iron toroidal forms to counteract characteristic self resonance.

17 Claims, 11 Drawing Sheets

DIPLEX FILTER COMPRISING MONOTONIC POLES

FIELD OF THE INVENTION

This invention relates to passive signal splitting and combining circuits, and more particularly, to a diplex filter with improved performance characteristics, yet simpler circuit design.

BACKGROUND OF THE INVENTION

In coaxial distribution systems requiring both forward and reverse communications in separate frequency bands upon a single coaxial cable, e.g. frequency division multiplexing, a device is required to separate and combine two signal paths upon a common center conductor. In the past, passive splitting networks using ferrite bead wound autotransformers have accomplished this task, but with an undesirable effect of 3 dB of broad-band loss for each network.

Diplex filters can also be used to separate and combine signal paths. A diplex filter is a three terminal device having an overall frequency response, for example, from or near DC (0 Hz) through a highest specified frequency. A first, or common, terminal can be used as an input or output terminal depending upon whether frequency bands are to be separated or combined. A second, or "high", terminal has a response from an upper cutoff frequency to the highest specified frequency while a third, or "low", terminal has a response from DC through a lower cutoff frequency. Like the common terminal, the high and low terminals can operate as either input or output terminals.

The diplex filter finds application in many technologies where bidirectional communications over a single center conductor is required. As examples, the use of the CATV transport system to carry high speed data between a subscriber and the Internet or other service supplied via a Cable Modem would require a diplex filter at each end of the cable network. In a similar fashion the use of the existing cable infrastructure to carry telephone communications would require a diplex filter at each end of the network to separate the forward and reverse connections.

Diplex filters are often designed by combining low and high pass filters in appropriate configurations. Each filter design, however, has inherent and commonly-known advantages and disadvantages. For example, a Gaussian filter has very good group delay performance at the band edges, but performs poorly on the slope of the isolation at crossover frequencies. On the other hand, an elliptic function network has very steep slopes to the isolation at the crossover frequencies, but performs poorly on the band edge group delay parameter.

It is therefore an objective of the present invention to provide a diplex filter with superior performance characteristics which incorporates the advantages of classic filter designs, but avoids their associated disadvantages.

It is a further objective of the present invention to provide a diplex filter with minimally complex circuitry.

SUMMARY OF THE INVENTION

The diplex filter according to the present invention is a three terminal device having common, high, and low terminals. The device has a frequency response up to 1 GHz and comprises a Chebychev-like high pass filter section located between the common and high terminals and a Chebychev-like low pass filter located between the common and low terminals. Each filter section further comprises a series resonant circuit connected between the low and high terminals, respectively, and ground. In embodiments where lower crossover values are required, inductors are wound on powdered iron toroidal forms to counteract characteristic self resonance.

BRIEF DESCRIPTION OF THE DRAWINGS

The advantages and features of the present invention will become more clearly apparent from the following description of an illustrative embodiment of the invention, given as a non-restrictive example only and represented in the accompanying drawings, in which.

DETAILED DESCRIPTION OF THE PREFERRED EMBODIMENTS

Figure 1:
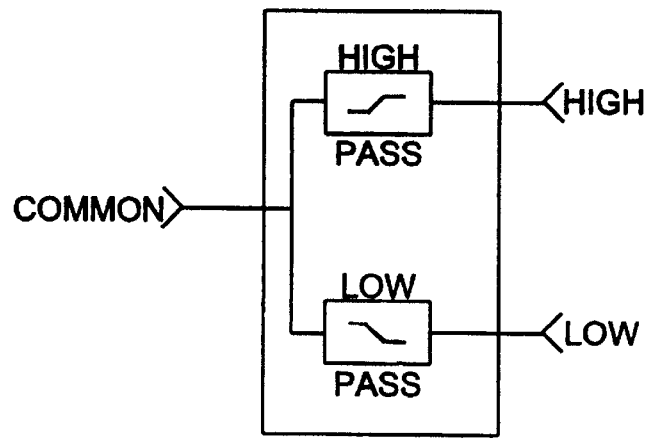
FIG. 1 is a functional diagram of a generic diplex filter.
Figure 2:
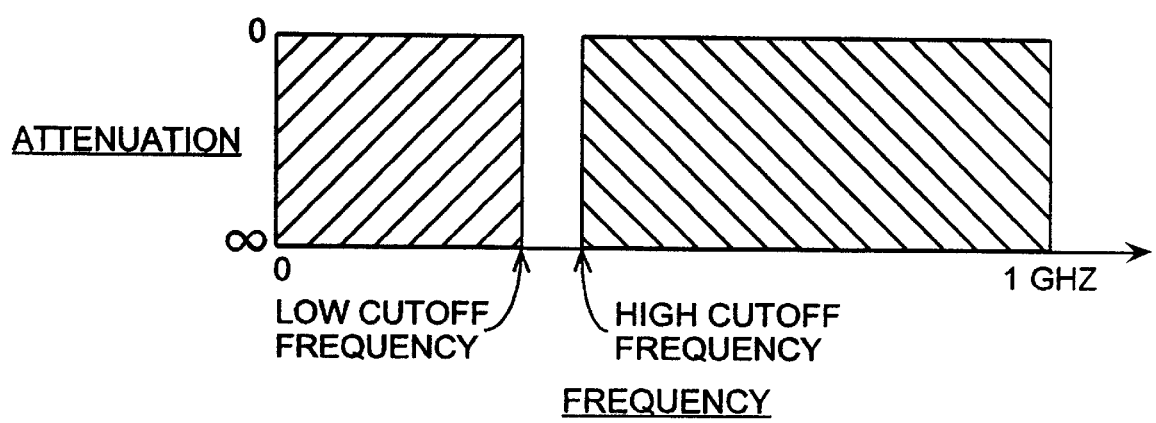
FIG. 2 is a frequency response plot of an ideal diplex filter.

With reference to FIG. 1, a diplex filter is a three terminal device which passes only high frequencies between the common and high terminals via a high pass filter portion and passes only low frequencies between the common and low terminals via a low pass filter portion. As shown in FIG. 2, an ideal diplex filter would have no insertion loss from DC through a lower cutoff frequency and infinite attenuation above that point for the low terminal frequency response. The ideal filter would further have infinite attenuation from DC through an upper cutoff frequency with no insertion loss above that point for the high terminal frequency response.

Figure 3:
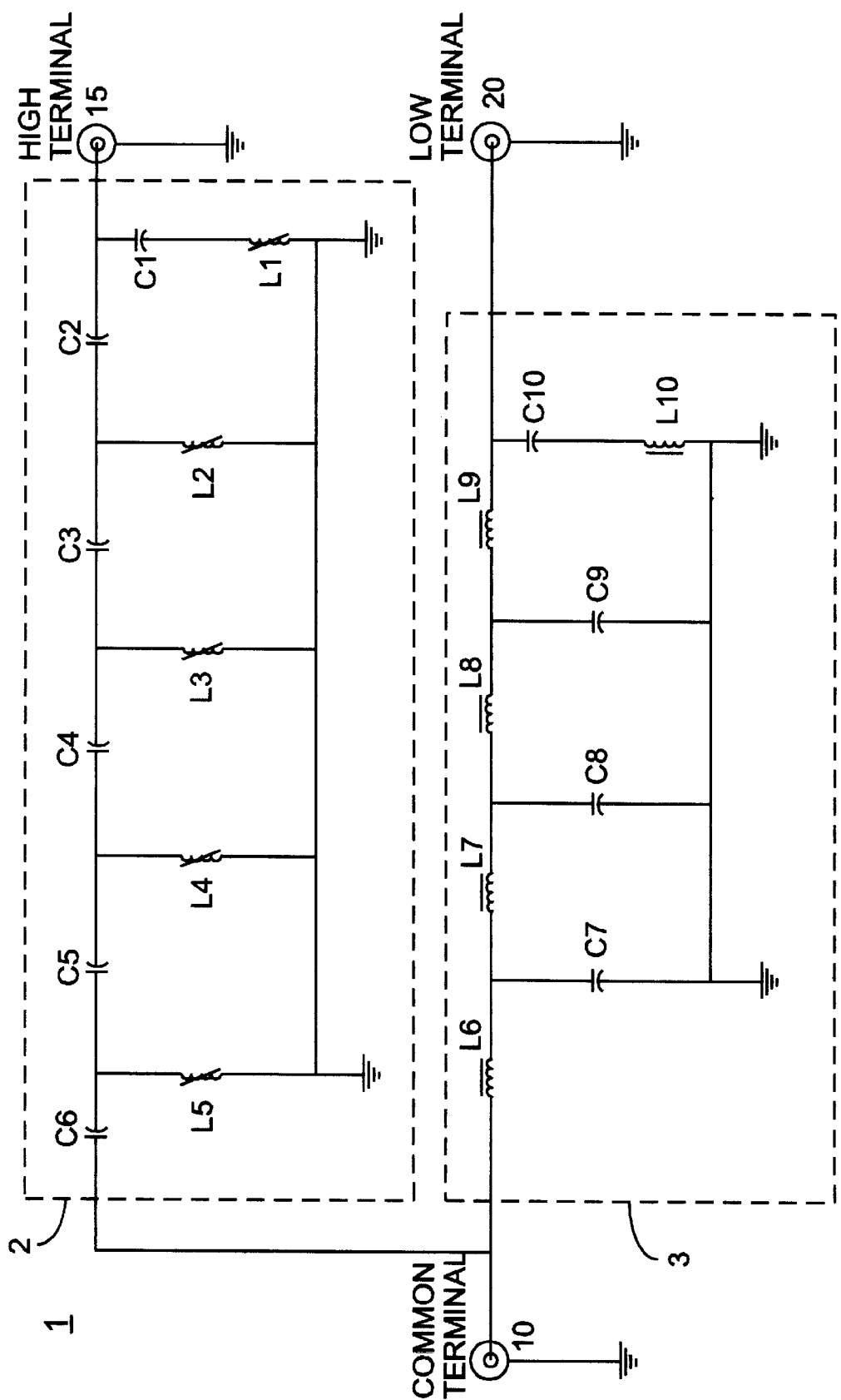
FIG. 3 is a schematic drawing of a diplex filter in accordance with the present invention.

Referring to FIG. 3, an electrical schematic diagram of a diplex filter 1 in accordance with the present invention is illustrated. The high pass filter portion 2 of the diplex filter is first described.

Common terminal 10 is connected to a first lead of capacitor C6. The second lead of capacitor C6 is connected to capacitor C5 and to inductor L5. The opposite lead of inductor L5 is connected to ground. The second lead of capacitor C5 is connected to capacitor C4 and inductor L4. The other lead of inductor L4 is grounded. Capacitor C4, in turn, is connected to capacitor C3 and inductor L3. The opposite side of inductor L3 is grounded. The second lead of capacitor C3 is connected to capacitor C2 and to inductor L2. The opposite side of inductor L2 is connected to ground. The second lead of capacitor C2 is connected to high terminal 15. Finally, the junction of capacitor C2 and high terminal 15 is connected to ground via a first series resonant circuit comprising capacitor C1 and inductor L1.

The components described above and located between the common terminal 10 and the high terminal 15 can be described as a 9-pole Chebychev-like circuit followed by a series resonant circuit to ground. Actual component values depart from a true Chebychev filter to allow for the impedance changes introduced by the series resonant circuit to ground.

The low pass filter 3 portion of the diplex filter is described next.

Common terminal 10 is connected to a first lead of inductor L6. The second lead of inductor L6 is connected to a first lead of inductor L7 and capacitor C7. The opposite side of capacitor C7 is connected to ground. The second lead of inductor L7 is connected to inductor L8 and capacitor C8. The opposite side of capacitor C8 is grounded. The second lead of inductor L8 is connected to a first lead of inductor L9 and capacitor C9. A second lead of capacitor C9 is grounded. The second lead of inductor L9 is connected to the low terminal 20. Finally, the junction of inductor L9 and low terminal 20 is connected to ground via a second series resonant circuit comprising C10 and L10.

Thus, the components located between the common terminal 10 and the low terminal 20 can be described as a 7-pole Chebychev-like circuit followed by a series resonant circuit to ground. As in the high pass filter portion 2, actual component values depart from a true Chebychev filter to allow for the impedance changes introduced by the second series resonant circuit to ground.

As is easily seen in FIG. 3, both the high pass filter portion 2 and low pass filter portion 3 comprise a plurality of single-component poles. Such poles are sometimes referred to as monotonic poles.

When designing a diplex filter described herein for certain crossover values, e.g. below 50 MHz, the inductance values required become large. At these frequencies, air core or molded inductors exhibit self resonance. That is, the inductance of the wire and the capacitance of the windings form a low impedance path, which falls below 1 GHz, for example, or within the high frequency band of the present invention. This results in unwanted perturbations in the form of high insertion loss for the diplex filter.

This self resonance phenomenon is counteracted in the present invention by winding certain inductors of the diplex filter 1 on powdered iron toroidal forms. The use of a powered iron toroid to wind an inductor results in a significant reduction in the length of wire required to achieve a given inductance. This results from the magnifying effect, on inductance, of having iron in the center of a coil. This reduces the number of turns and the inner diameter of those turns necessary for a given inductance. This in turn reduces the interwinding capacitance and the series resistance of the wire resulting in a significantly higher frequency of self resonance. Accordingly, by using toroidal forms, self resonance is dampened and shifted to frequencies beyond the diplex filter's specified frequency response.

Figure 4:
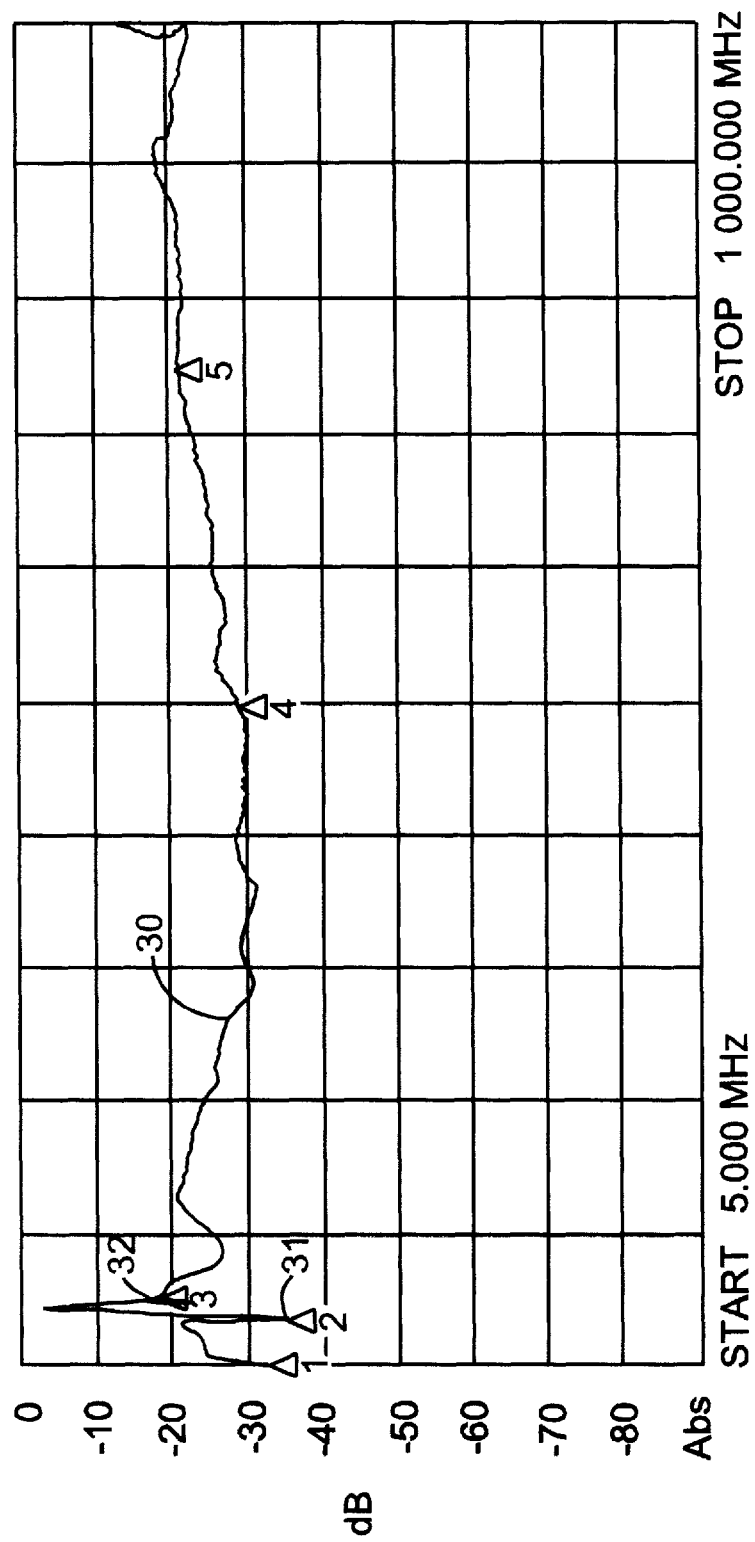
FIG. 4 is a frequency response plot of the common terminal return loss according to a preferred embodiment of the present invention.

FIGS. 4–12 are plots of one preferred embodiment of the present invention wherein the lower and upper cutoff frequencies are, respectively, 42 and 54 MHz. With reference to FIG. 4, curve 30 depicts the return loss of the common terminal 10 of the present invention when both the high and low terminals 15, 20 are terminated. As is evident from FIG. 4, the return loss is relatively constant over a 1 GHz bandwidth except within the frequency band bounded by the upper and lower cutoff frequencies, here shown by 31, 32.

Figure 5:
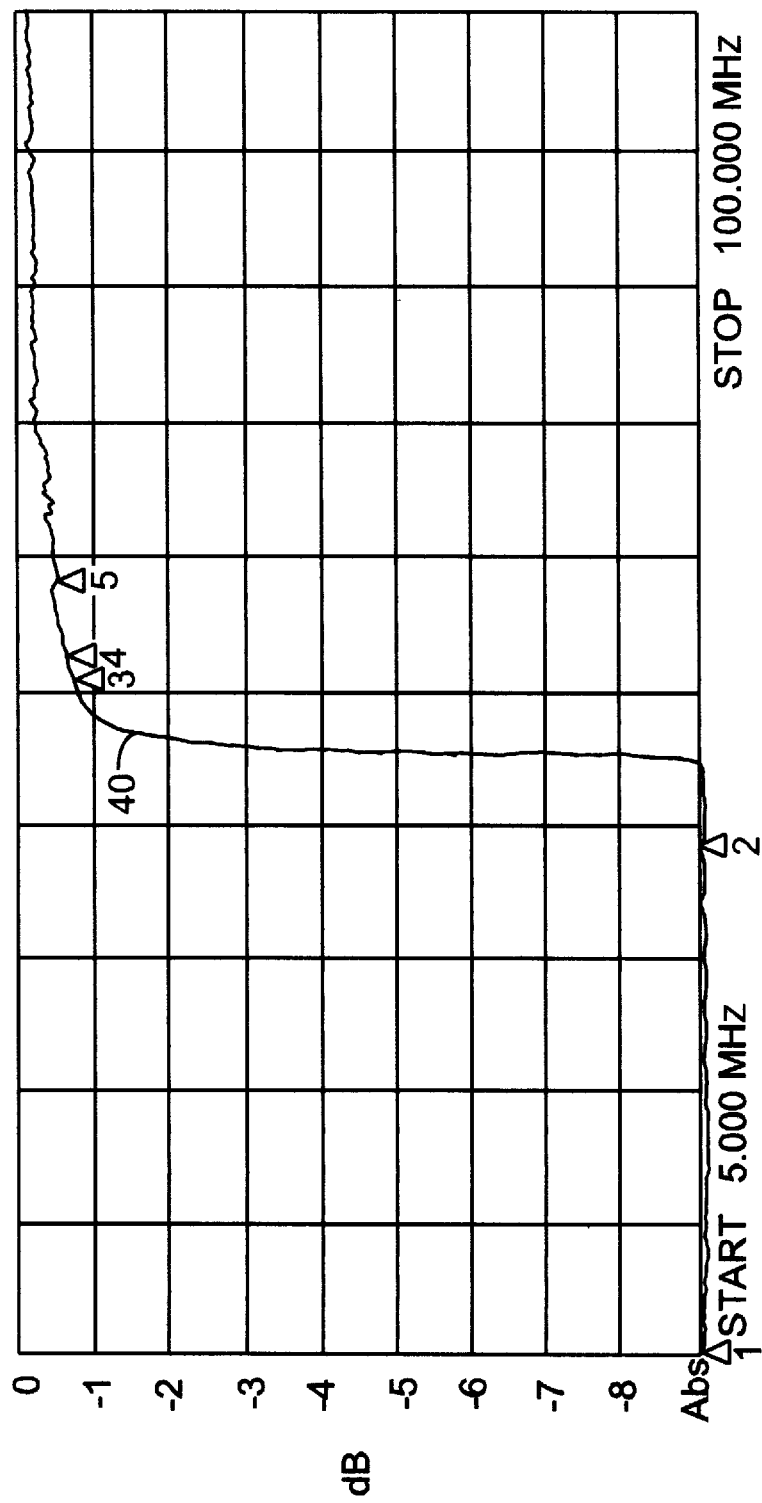
FIGS. 5–7 are frequency response plots of the common terminal to high terminal response according to a preferred embodiment of the present invention.
Figure 6:
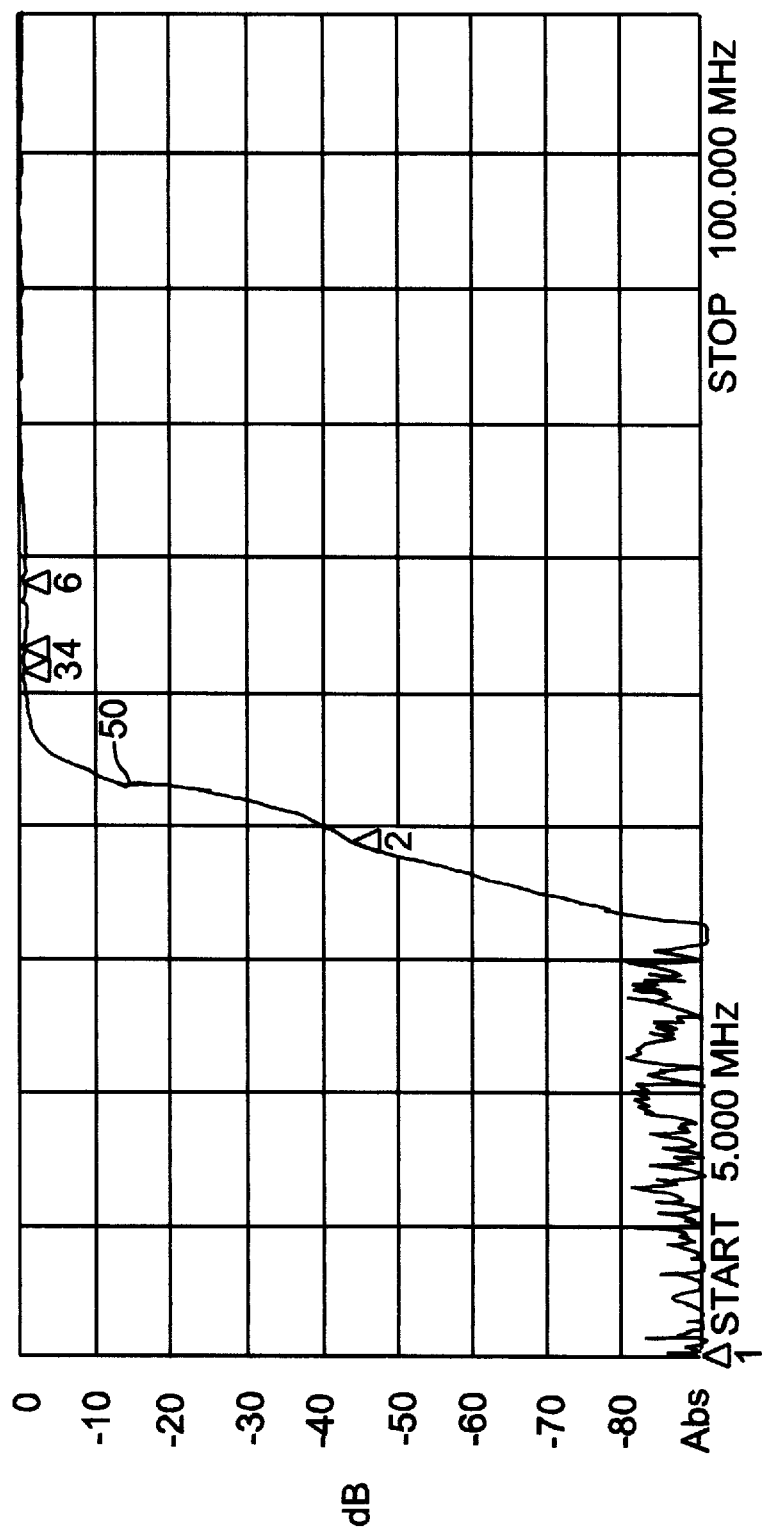
Figure 7:
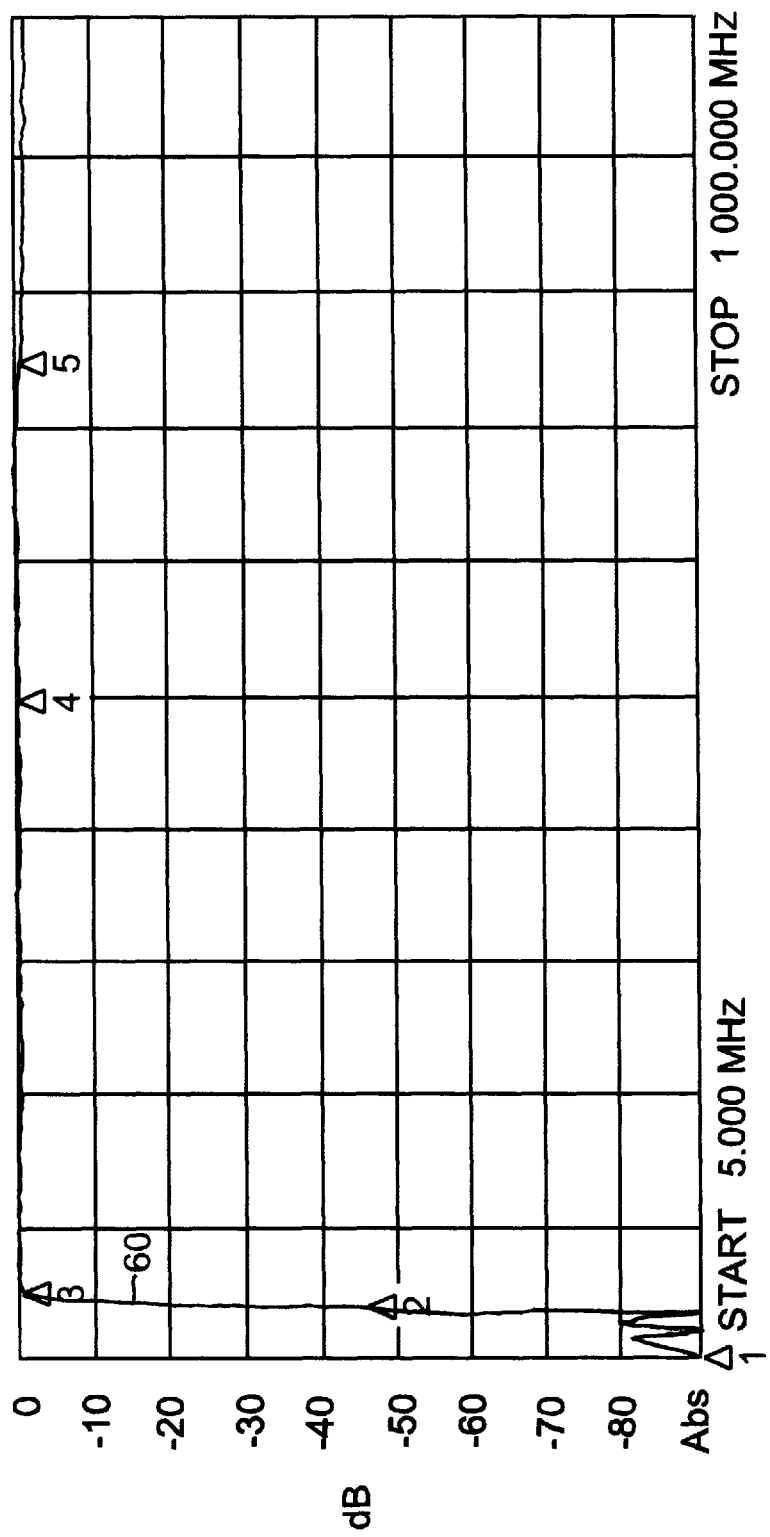

With reference to FIGS. 5–7, curves 40, 50 and 60 depict the common terminal 10 to high terminal 15 response of the present invention when low terminal 20 is terminated. FIGS. 5–7 show the same response, but presented in different resolutions and bandwidths as indicated.

Figure 8:
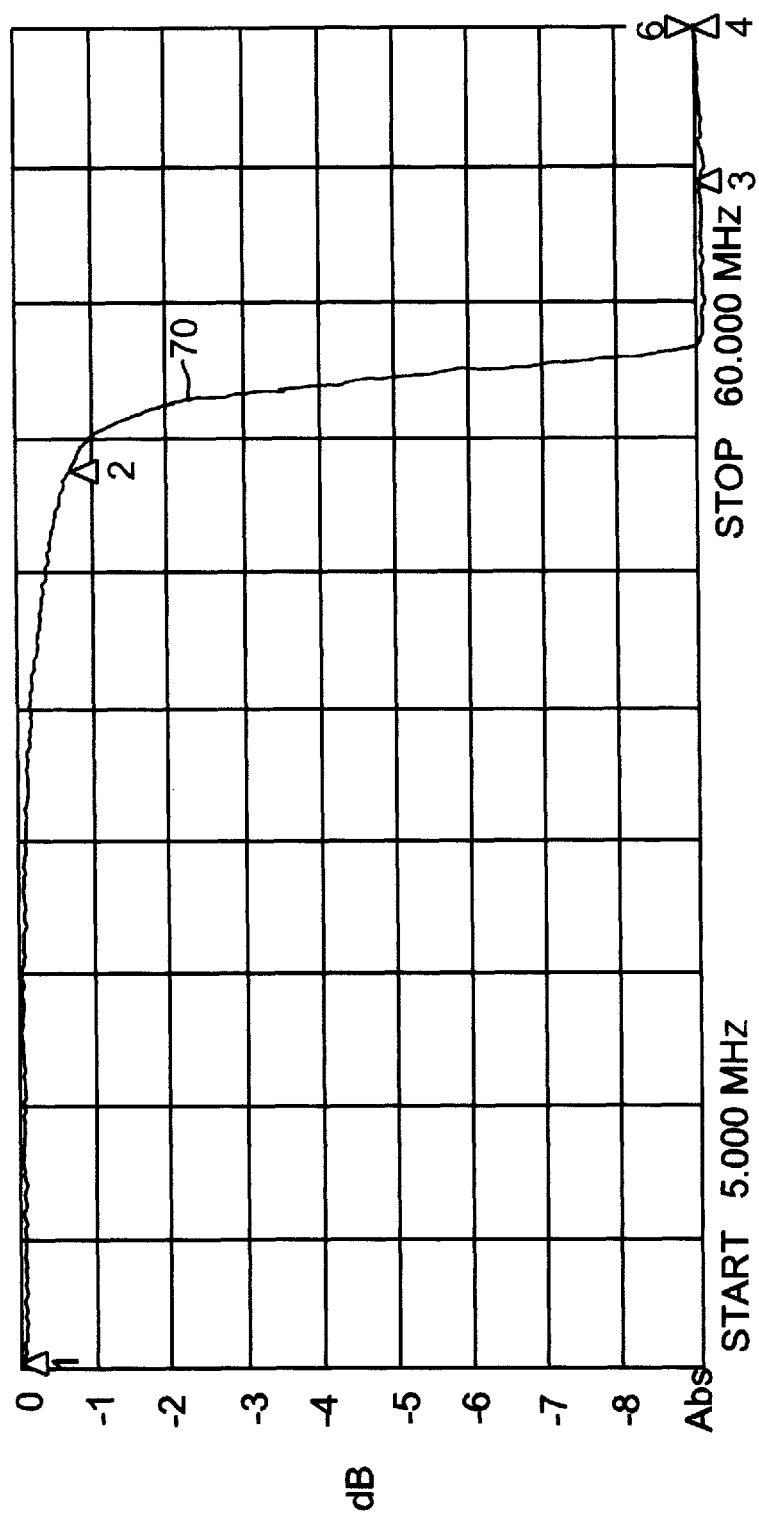
FIGS. 8–10 are frequency response plots of the common terminal to low terminal response according to a preferred embodiment of the present invention.
Figure 9:
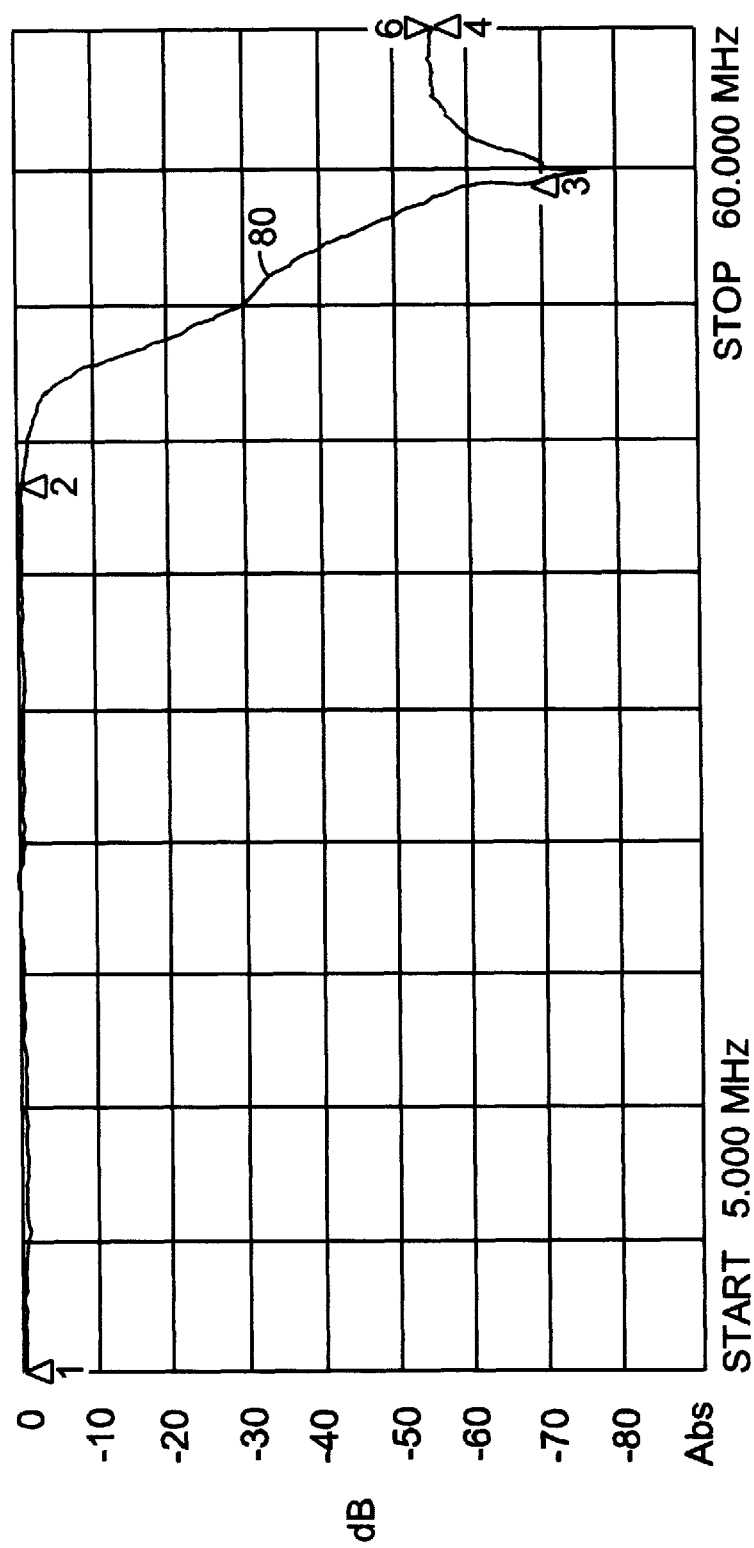
Figure 10:
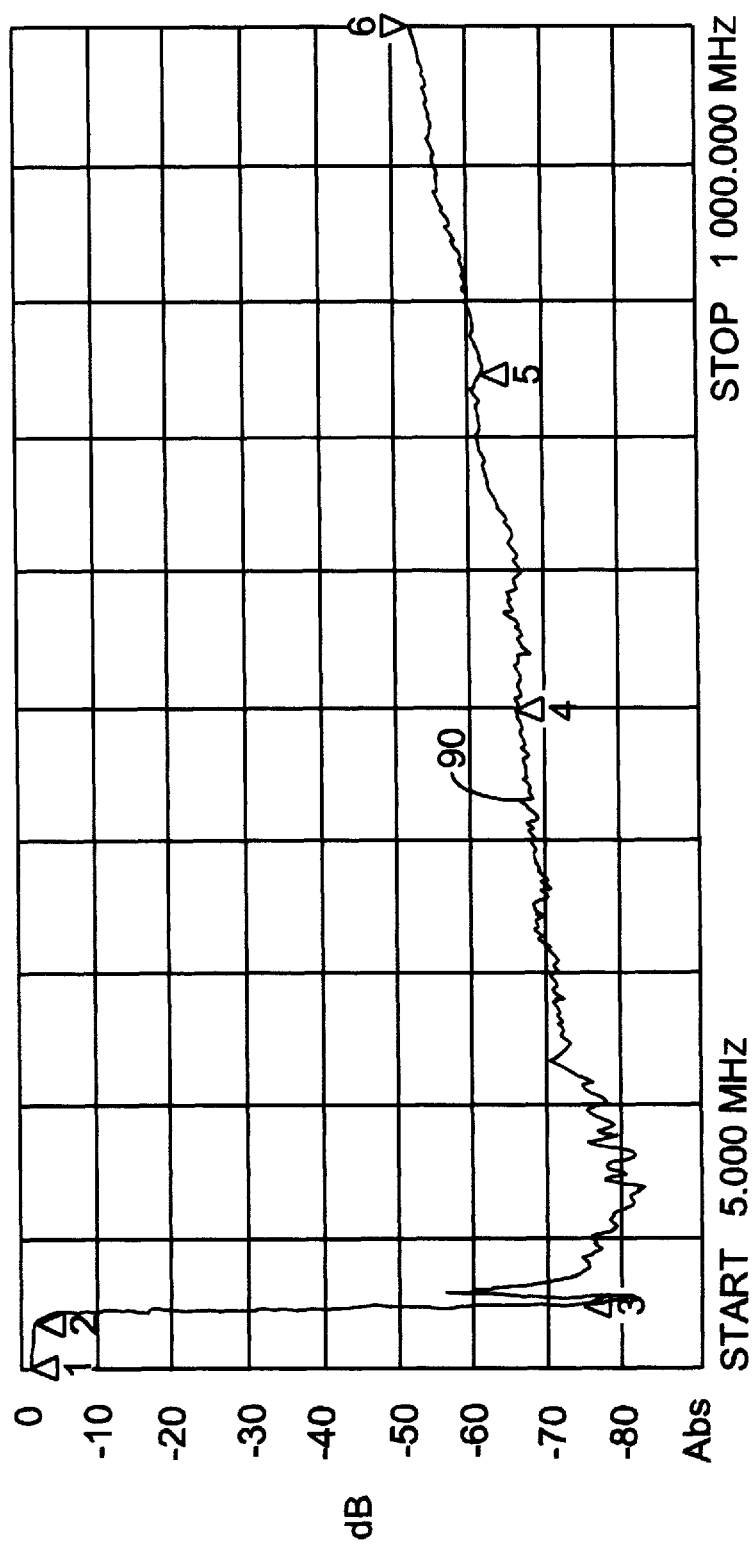

Curves 70, 80, 90, respectively, of FIGS. 8–10 depict the common terminal 10 to low terminal 20 response of the present invention when high terminal 15 is terminated. FIGS. 8–10 show the same response, but presented at different resolutions and bandwidths as indicated.

Figure 11:
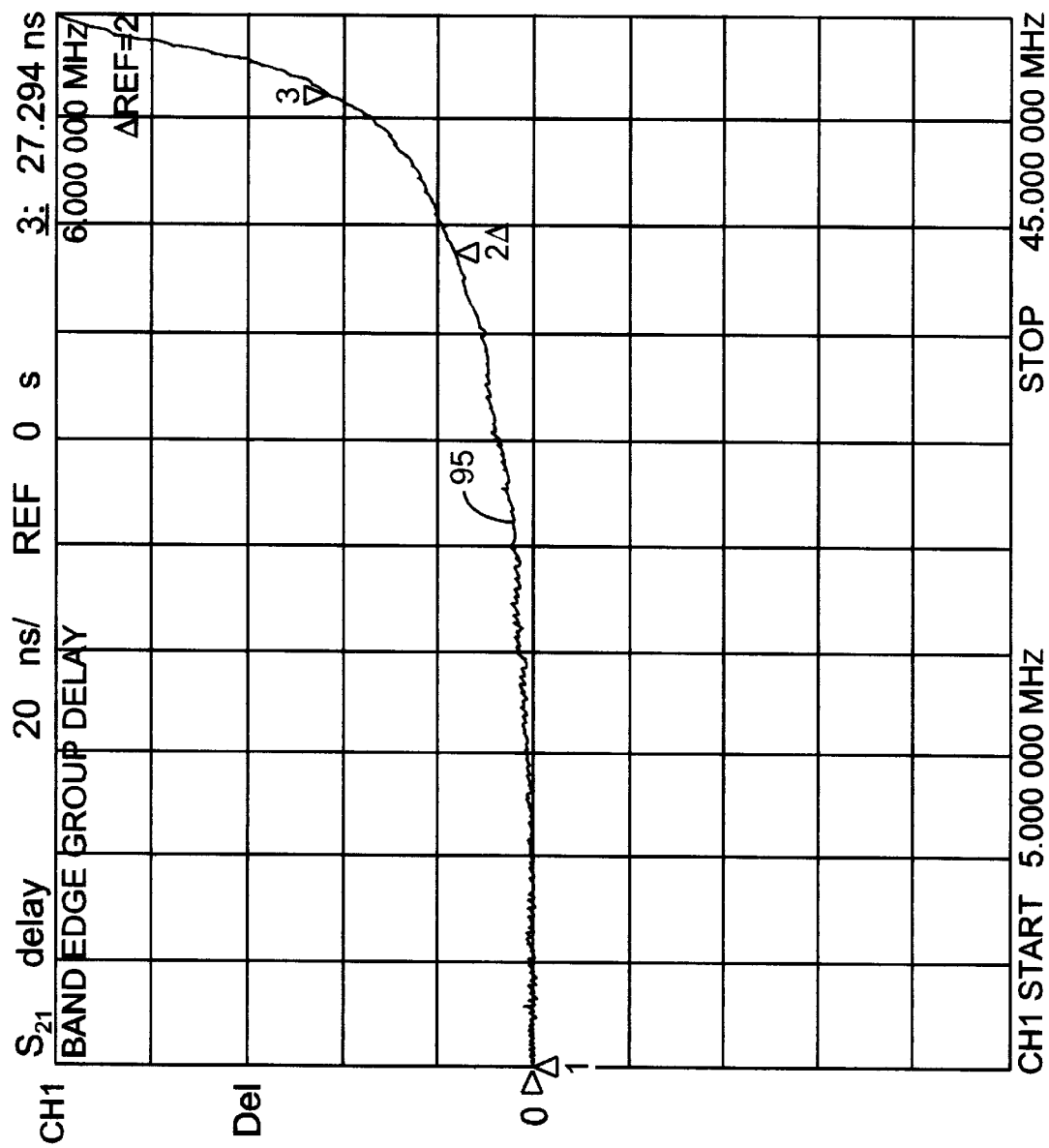
FIG. 11 is a plot of the low terminal edge group delay according to a preferred embodiment of the present invention.

Curve 95 of FIG. 11 is a presentation of group delay when measured from the common terminal 10 to the low terminal 20 of the diplex filter. As indicated on the plot, the reference line is in the center of the display vertically and is referenced to 0 seconds. The display span per division, vertically, is 20 nanoseconds. The horizontal sweep starts at 5 MHz and stops at 45 MHz.

Marker number 2 is labeled with a delta, indicating that the measurements in the upper right corner of the plot are all relative to this marker. Curve 95 shows that the group delay over the last 6 MHz of the diplex filter's common to low terminal frequency response (36 to 52 MHz) is 27.294 nanoseconds. In view of the steep slopes obtained by the present invention, this group delay is excellent.

Figure 12:
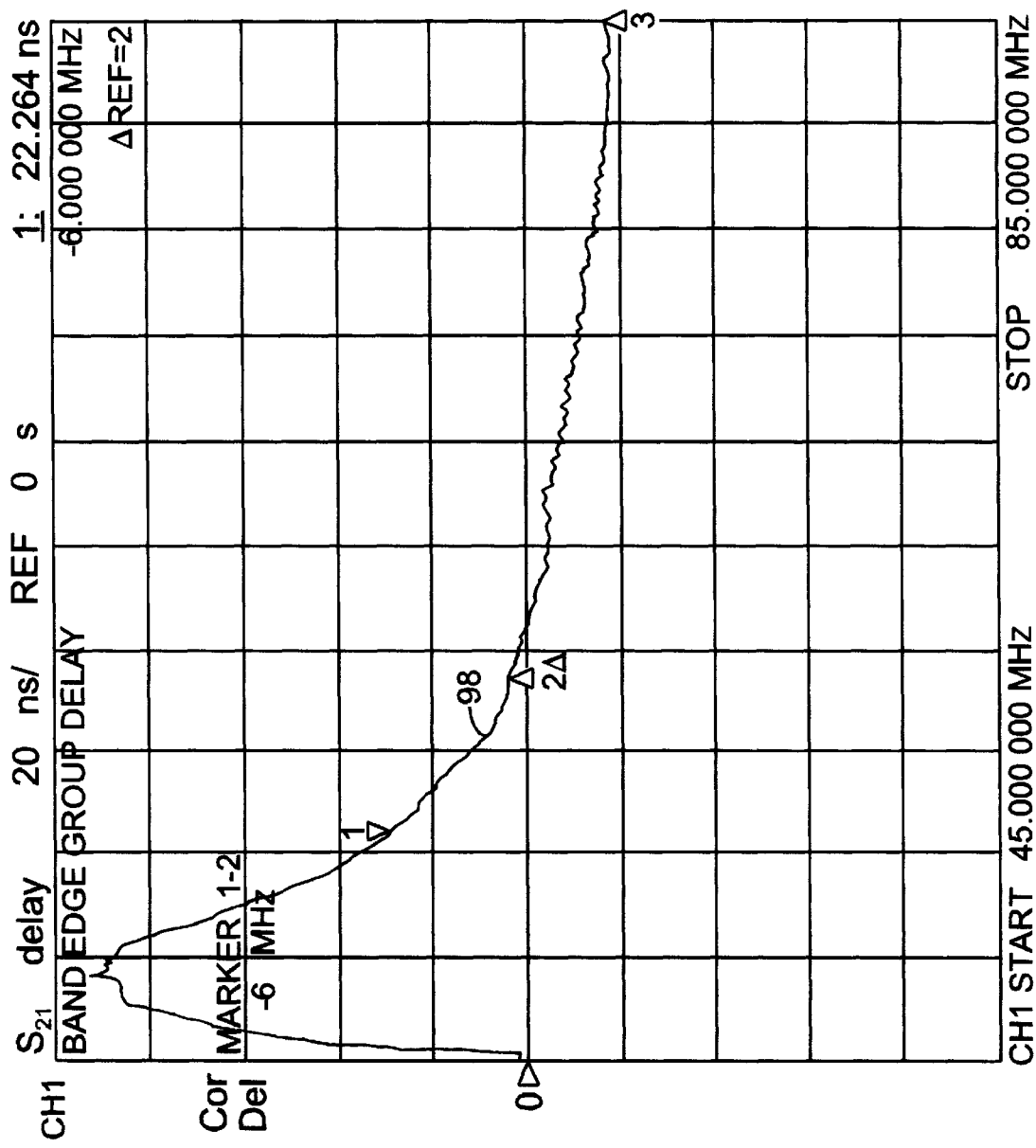
FIG. 12 is a plot of the high terminal edge group delay according to a preferred embodiment of the present invention.

Curve 98 of FIG. 12 is the group delay taken across the common terminal 10 to high terminal 15 of the diplex filter and displays that the group delay of this network from 54 to 60 MHz is 22.964 nanoseconds.

Table 1 shows component values for diplex filters in accordance with the present invention and corresponding to embodiments having alternative lower and upper cutoff frequency values. In the table, the notation "t" means turns of wire. Air wound coils preferably comprise 24 gauge AWG magnet wire wound on a 0.180 inch mandrel. The toroids preferably have a permeability of 8, have a 0.250 inch outer diameter, a 0.120 inch inner diameter, a 0.096 inch thickness, a mean length of 1.50 cm and a cross-section of 0.042 cm$^2$. A 28 gauge AWG magnet wire is preferably used to wind the toroids.

TABLE 1

Diplex Filter Component Values

|     | 42/54 MHz | 50/70 MHz | 65/85 MHz | 65/120 MHz | 112/150 MHz | 750/850 MHz |
| --- | --- | --- | --- | --- | --- | --- |
| C1  | 47 pf | 47 pf | 39 pf | 20 pf | 18 pf | 2.7 pf |
| C2  | 27 pf | 24 pf | 18 pf | 12 pf | 9.1 pf | 1.0 pf |
| C3  | 24 pf | 20 pf | 15 pf | 10 pf | 7.5 pf | 0.75 pf |
| C4  | 22 pf | 18 pf | 13 pf | 9.1 pf | 6.8 pf | 0.75 pf |
| C5  | 24 pf | 20 pf | 15 pf | 10 pf | 7.5 pf | 0.75 pf |
| C6  | 27 pf | 24 pf | 18 pf | 12 pf | 9.1 pf | 1.0 pf |
| C7  | 82 pf | 68 pf | 56 pf | 56 pf | 27 pf | 3.3 pf |
| C8  | 82 pf | 68 pf | 56 pf | 56 pf | 27 pf | 3.6 pf |
| C9  | 82 pf | 68 pf | 56 pf | 56 pf | 27 pf | 3.3 pf |
| C10 | 27 pf | 20 pf | 15 pf | 15 pf | 9.1 pf | 1.5 pf |
| L1  | 11 t toroid | 9 t toroid | 8.5 t coil | 7.5 t coil | 7.5 t coil | 2.5 t coil |
| L2  | 6.5 t coil | 5.5 t coil | 4.5 t coil | 3.5 t coil | 4.5 t coil | 1.5 t coil |
| L3  | 6.5 t coil | 5.5 t coil | 4.5 t coil | 3.5 t coil | 4.5 t coil | 1.5 t coil |
| L4  | 6.5 t coil | 5.5 t coil | 4.5 t coil | 3.5 t coil | 4.5 t coil | 1.5 t coil |
| L5  | 6.5 t coil | 5.5 t coil | 4.5 t coil | 3.5 t coil | 4.5 t coil | 1.5 t coil |
| L6  | 11 t toroid | 10 t toroid | 8.5 t coil | 9.5 t coil | 7.5 t coil | 2.5 t coil |
| L7  | 13 t toroid | 11 t toroid | 9.5 t coil | 10.5 t coil | 9.5 t coil | 2.5 t coil |
| L8  | 13 t toroid | 11 t toroid | 9.5 t coil | 10.5 t coil | 9.5 t coil | 2.5 t coil |

TABLE 1-continued

Diplex Filter Component Values

| | 42/54 MHz | 50/70 MHz | 65/85 MHz | 65/120 MHz | 112/150 MHz | 750/850 MHz |
|---|---|---|---|---|---|---|
| L9 | 11 t toroid | 10 t toroid | 8.5 t coil | 9.5 t coil | 7.5 t coil | 2.5 t coil |
| L10 | 10.5 t coil | 10.5 t coil | 7.5 t coil | 7.5 t coil | 6.5 t coil | 1.5 t coil |

The invention has been described with reference to certain preferred embodiments thereof. It will be understood, however, that variations and modifications are possible within the scope of the appended claims. For example, although, the high and low pass portions 2, 3 have been described as 9 and 7 pole circuits, respectively, different order circuits could be employed. Furthermore, while frequency response FIGS. 4–12 depict a diplex filter with upper and lower cutoff frequencies of, respectively, 42 and 54 MHz, the invention is applicable to a wide range of crossover values.

What is claimed is:

1. A three port diplex filter circuit, comprising:
   a high pass filter portion, connected between a first port and a second port, including at least five capacitors connected in series, only an inductor connected between each node formed between adjoining capacitors and ground, and a first series resonant circuit connected between said second port and ground; and
   a low pass filter portion, connected between said first port and a third port, including at least four inductors connected in series, only a capacitor connected between each node formed between adjoining inductors and ground, and a second series resonant circuit connected between said third port and ground.

2. The diplex filter circuit as claimed in claim 1, wherein said low pass filter portion has a bandwidth from about 0 Hz to a lower cutoff frequency.

3. The diplex filter circuit as claimed in claim 1, wherein said high pass filter portion has a bandwidth from an upper cutoff frequency to about 1 GHz.

4. The diplex filter circuit as claimed in claim 1, wherein said upper cutoff frequency is greater than said lower cutoff frequency.

5. The diplex filter circuit as claimed in claim 1, wherein said low pass filter portion has a bandwidth from about 0 Hz to a lower cutoff frequency and said high pass filter portion has a bandwidth from an upper cutoff frequency to about 1 GHz and wherein said upper cutoff frequency is greater than said lower cutoff frequency.

6. The diplex filter of claim 5, wherein the lower cutoff frequency is between about 42 MHz and about 750 MHz.

7. The diplex filter of claim 5, wherein the upper cutoff frequency is between about 54 MHz and 850 MHz.

8. The diplex filter as claimed in claim 5 wherein said lower cutoff frequency is about 42 MHz and said upper cutoff frequency is about 54 MHz.

9. The diplex filter as claimed in claim 5 wherein said lower cutoff frequency is about 50 MHz and said upper cutoff frequency is about 70 MHz.

10. The diplex filter as claimed in claim 5 wherein said lower cutoff frequency is about 65 MHz and said upper cutoff frequency is about 85 MHz.

11. The diplex filter as claimed in claim 5 wherein said lower cutoff frequency is about 65 MHz and said upper cutoff frequency is about 120 MHz.

12. The diplex filter as claimed in claim 5 wherein said lower cutoff frequency is about 112 MHz and said upper cutoff frequency is about 150 MHz.

13. The diplex filter as claimed in claim 5 wherein said lower cutoff frequency is about 750 MHz and said upper cutoff frequency is about 850 MHz.

14. The diplex filter circuit as claimed in claim 1, wherein said high pass filter portion comprises a monotonic 9-pole circuit and said first series resonant circuit.

15. The diplex filter circuit as claimed in claim 1 wherein said low pass filter portion comprises a monotonic 7-pole circuit and said second series resonant circuit.

16. A three port diplex filter circuit, comprising:
   a high pass filter portion, connected between a first port and a second port, including at least five capacitors connected in series, only an inductor connected between each node formed between adjoining capacitors and ground, and a first series resonant circuit connected between said second port and ground; and
   a low pass filter portion, connected between said first port and a third port, including at least four inductors connected in series, at least one of said at least four series-connected inductors being wound on a powdered iron toroidal form, only a capacitor connected between each node formed between adjoining inductors and ground, and a second series resonant circuit connected between said third port and ground,
   whereby the frequency of the characteristic self resonance of said at least one inductor wound on a powdered iron toroidal form is set beyond the frequency range of said high pass filter portion.

17. The diplex filter circuit as claimed in claim 16 wherein all of said series-connected inductors in said low pass filter portion are wound on powdered iron toroidal forms.

* * * * *